United States Patent
Otremba et al.

(10) Patent No.: US 9,263,563 B2
(45) Date of Patent: Feb. 16, 2016

(54) SEMICONDUCTOR DEVICE PACKAGE

(71) Applicant: Infineon Technologies Austria AG, Villach (AT)

(72) Inventors: Ralf Otremba, Kaufbeuren (DE); Fabio Brucchi, Villach (AT); Franz Stückler, St. Stefan (AT); Teck Sim Lee, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/068,549

(22) Filed: Oct. 31, 2013

(65) Prior Publication Data

US 2015/0115313 A1    Apr. 30, 2015

(51) Int. Cl.
| | |
|---|---|
| *H01L 29/66* | (2006.01) |
| *H01L 23/495* | (2006.01) |
| *H01L 29/747* | (2006.01) |
| *H01L 23/00* | (2006.01) |

(52) U.S. Cl.
CPC ........ *H01L 29/747* (2013.01); *H01L 23/49503* (2013.01); *H01L 23/49524* (2013.01); *H01L 23/49562* (2013.01); *H01L 23/49575* (2013.01); *H01L 24/40* (2013.01); *H01L 24/49* (2013.01); *H01L 24/73* (2013.01); *H01L 24/06* (2013.01); *H01L 24/48* (2013.01); *H01L 2224/0603* (2013.01); *H01L 2224/32245* (2013.01); *H01L 2224/40137* (2013.01); *H01L 2224/48091* (2013.01); *H01L 2224/48137* (2013.01); *H01L 2224/48247* (2013.01); *H01L 2224/4903* (2013.01); *H01L 2224/49111* (2013.01); *H01L 2224/49113* (2013.01); *H01L 2224/49175* (2013.01); *H01L 2224/73263* (2013.01); *H01L 2224/73265* (2013.01); *H01L 2924/00014* (2013.01); *H01L 2924/13055* (2013.01)

(58) Field of Classification Search
CPC ................................ H01L 29/76; H01L 23/00
USPC ................. 257/174, 297, 345, 349, 372–376, 257/386–389, 394–400, 483–484, 503, 547, 257/583, 620, 629–652, E23.169–E23.178, 257/E29.116–E29.122, E29.284, E29.299, 257/E21.432, E21.44, E21.619, E21.62, 257/678–733, 787–796, E23.001, E23.194, 257/E21.499–E21.519; 438/15, 26, 51, 55, 438/64, 106, 124–127
See application file for complete search history.

(56) References Cited

U.S. PATENT DOCUMENTS

| | | | |
|---|---|---|---|
| 6,020,636 A * | 2/2000 | Adishian | H01L 23/49562 257/723 |
| 7,227,198 B2 | 6/2007 | Pavier et al. | |
| 7,605,570 B2 | 10/2009 | Liu et al. | |
| 8,039,954 B2 | 10/2011 | Osawa et al. | |
| 8,723,238 B1 * | 5/2014 | Padmanabhan | H01L 29/76 257/288 |
| 2006/0033122 A1 * | 2/2006 | Pavier | H01L 23/49562 257/177 |
| 2006/0237825 A1 * | 10/2006 | Pavier | H01L 23/15 257/666 |

(Continued)

*Primary Examiner* — Amar Movva
*Assistant Examiner* — Sheikh Maruf
(74) *Attorney, Agent, or Firm* — Murphy, Bilak & Homiller, PLLC (57) ABSTRACT

In an embodiment, a semiconductor device package includes a bidirectional switch circuit. The bidirectional switch circuit includes a first semiconductor transistor mounted on a first die pad, a second semiconductor transistor mounted on a second die pad, the second die pad being separate from the first die pad, and a conductive connector extending between a source electrode of the first transistor and a source electrode of the second transistor.

9 Claims, 4 Drawing Sheets

(56) References Cited

U.S. PATENT DOCUMENTS

| | | | |
|---|---|---|---|
| 2007/0166877 A1* | 7/2007 | Otremba | H01L 23/49513 438/106 |
| 2007/0216390 A1* | 9/2007 | Wai | H02M 7/797 323/351 |
| 2008/0054422 A1* | 3/2008 | Koike | H01L 21/565 257/676 |
| 2008/0304305 A1* | 12/2008 | Chang | H01L 25/16 363/147 |
| 2009/0058500 A1 | 3/2009 | Osawa et al. | |
| 2009/0218676 A1* | 9/2009 | Muto | H01L 23/49513 257/693 |
| 2010/0213510 A1 | 8/2010 | Osawa et al. | |
| 2011/0221008 A1* | 9/2011 | Lu | H01L 23/49517 257/391 |
| 2012/0121304 A1* | 5/2012 | Tokuda | G03G 15/2039 399/329 |
| 2012/0161304 A1* | 6/2012 | Liu et al. | 257/676 |
| 2012/0262828 A1* | 10/2012 | Muthukrishnan | H02H 9/046 361/56 |
| 2013/0107583 A1* | 5/2013 | Seok | H02M 3/33576 363/21.12 |

* cited by examiner

SEMICONDUCTOR DEVICE PACKAGE

BACKGROUND

Two or more power semiconductor devices such as diodes, transistors and the like may be arranged in a circuit to provide various configurations or functions. For example, two MOSFET transistors may be arranged in a circuit to provide a half-bridge configuration or a bidirectional switch which can supply electric current bi-directionally. Bidirectional switches may be used in applications such as electric power conversion circuits or plasma display apparatus, for example.

SUMMARY

In an embodiment, a semiconductor device package includes a bidirectional switch circuit. The bidirectional switch circuit includes a first semiconductor transistor mounted on a first die pad, a second semiconductor transistor mounted on a second die pad, the second die pad being separate from the first die pad, and a conductive connector extending between a source electrode of the first transistor and a source electrode of the second transistor.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As used herein, a "high-voltage device", such as a high-voltage depletion-mode transistor, is an electronic device which is optimized for high-voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300 V, 600 V, 1200 V, or other suitable blocking voltage required by the application.

As used herein, a "low-voltage device", such as a low-voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein, the terms "source electrode" and "source" also include the functional equivalents of an emitter electrode and emitter, respectively, of a bipolar transistor such as an Insulated Gate Bipolar Transistor. The terms "drain electrode" and "drain" include the functional equivalents of a collector and a collector electrode, respectively, of a bipolar transistor such as an Insulated Gate Bipolar Transistor.

Figure 1:
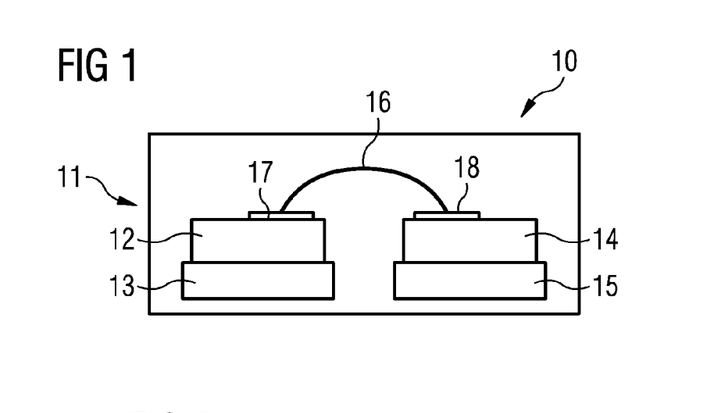
FIG. 1 illustrates a schematic cross-sectional view of a semiconductor device package according to a first embodiment.

FIG. 1 illustrates a schematic view of a semiconductor device package 10 according to a first embodiment. The semiconductor device package 10 includes a bidirectional switch circuit 11. The bidirectional switch circuit 11 includes a first semiconductor transistor 12 mounted on a first die pad 13 and a second semiconductor transistor 14 mounted on a second die pad 15. The second die pad 15 is separate from the first die pad 13. The bidirectional switch circuit 11 further includes a conductive connector 16 which extends between a source electrode 17 of the first semiconductor transistor 12 and a source electrode 18 of the second semiconductor transistor 14.

The conductive connector 16 may be configured to provide a current path through the bidirectional switch circuit 11. The conductive connector 16 may be provided in the form of a clip or, as illustrated in FIG. 1, in the form of a bond wire. The conductive connector may also include a plurality of bond wires. The semiconductor device package 10 may further include a housing, wherein the conductive connector 16 is arranged within the housing. The housing may include epoxy resin, for example. The epoxy resin may electrically insulate the first die pad 13 from the second die pad 15 and may encapsulate the conductive connector 16.

The package may be configured to have a standard package outline such as a TO-220 outline or a TO-247 outline. The package may include five leads. The leads may also be described as pins. The drain electrode of the first semiconductor transistor 12 may be electrically coupled to the first die pad 13. A first drain lead of the semiconductor device package may extend from the first die pad 13. A drain electrode of the second semiconductor transistor 14 may be mounted on the second die pad 15. A second drain lead may extend from the second die pad 15.

The semiconductor device package 10 may further include a first conductive sense connector extending from the source electrode 17 of the first semiconductor transistor 12 to a sense lead of the package and a second conductive sense connector which extends from the source electrode 18 of the second semiconductor transistor 14 to the sense lead of the semiconductor device package 10. The first conductive sense connector and the second conductive sense connector may be electrically coupled to a common sense lead of the semiconductor device package 10.

The semiconductor device package 10 may include a second conductive connector extending from a gate of the first semiconductor transistor 12 to a first gate lead of the package and may include a second conductive connector extending from a gate of the second semiconductor transistor 14 to a second gate lead of the package.

The first semiconductor transistor 12 and the second semiconductor transistor 14 may be arranged mirror symmetrically within the semiconductor device package 10.

The first semiconductor transistor 12 and the second semiconductor transistor 14 may be a MOSFET device, an insulated gate bipolar transistor (IGBT) or a Group III nitride-based transistor such as a GaN-based High Electron Mobility Transistor (HEMT). The first semiconductor transistor 12 and the second semiconductor transistor 14 may be high voltage devices.

The first semiconductor transistor 12 may have a lateral area that is larger than a lateral area of the second semiconductor transistor 14. The lateral area defines the physical extent of the transistor device.

The semiconductor device package 10 may include a first input/output lead extending from the first die pad 13 and a second output/input lead extending from the second of die pad 15, the first gate lead and a second gate lead.

The terms "first input/output lead" and "second output/input lead" are used to indicate that when the first lead is acting as an input lead, the second lead acts as an output lead and when the first lead acts as an output lead, the second lead acts as an input lead.

The semiconductor device package 10 may further include a sense lead.

According to embodiments described herein, a semiconductor device package is provided that includes a bidirectional switch circuit within a single package outline. Thus, the semiconductor device package may be used in place of two more separate packages providing differing portions of the bidirectional switch circuit. For example, a first package including a first transistor, a second package including a second transistor and a conductive connection between them may be replaced by a single package accommodating these elements. A single semiconductor device package may be used to save space on a circuit board by providing a bidirectional switch with a smaller footprint.

Figure 2:
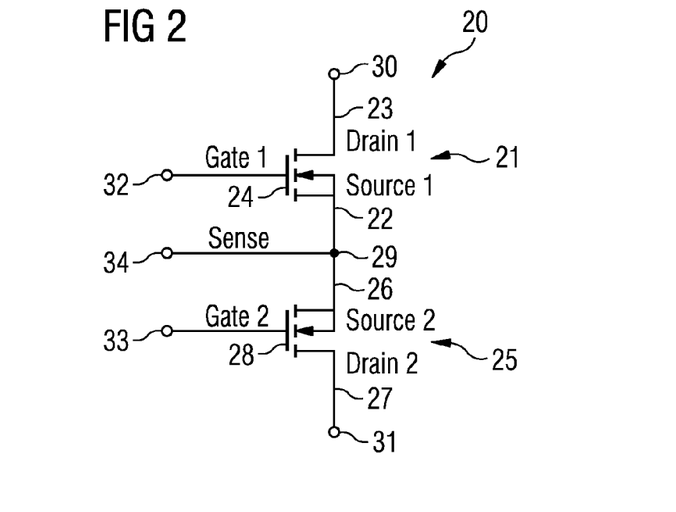
FIG. 2 illustrates an exemplary bidirectional switch circuit.

FIG. 2 illustrates an exemplary bidirectional switch circuit 20. The bidirectional switch circuit 20 includes a first semiconductor transistor 21 having a source electrode 22, a drain electrode 23 and a gate electrode 24. The bidirectional switch circuit 20 also includes a second transistor 25 including a source electrode 26, a drain electrode 27 and a gate electrode 28. The source electrode 22 of the first semiconductor transistor 21 is electrically coupled to the source electrode 26 of the second transistor 25 and forms a node 29 of the bidirectional switch circuit 20 which forms part of the current path of the bidirectional switch circuit 20.

The bidirectional switch circuit 20 includes a first input/output lead 30 coupled to the drain electrode 23 of the first semiconductor transistor 21, a second input/output lead 31 coupled to the drain electrode 27 of the second transistor 25, a first gate lead 32 coupled to the first gate electrode 24 of the first transistor 21, a second gate lead 33 coupled to the gate electrode 28 of the second transistor 25. A sense lead 34 is coupled to the node 29 formed between the source electrode 22 of the first transistor 21 and the source electrode 26 of the second transistor 25.

Current may flow through the bidirectional switch circuit 20 from the first input/output lead 30 to the second input/output lead 31 or from the second input/output lead 31 to the first input output/lead 30.

The two transistors 21, 25 and the node 29 may be positioned entirely within the semiconductor device package and the leads 30, 31, 32, 33 and 34 may extend from the semiconductor device package and be accessible from outside of the semiconductor device package.

Figure 3:
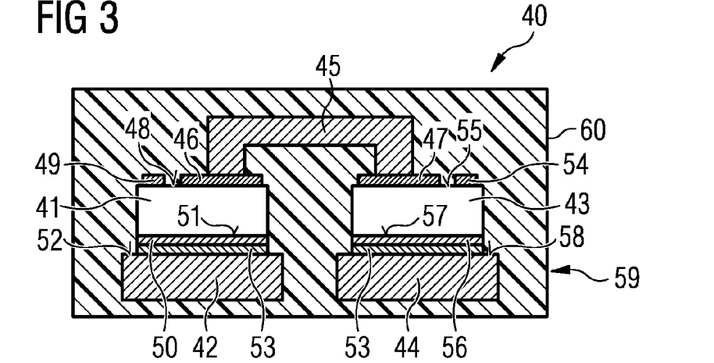
FIG. 3 illustrates a schematic cross-sectional view of a semiconductor device package according to a second embodiment.
Figure 4:
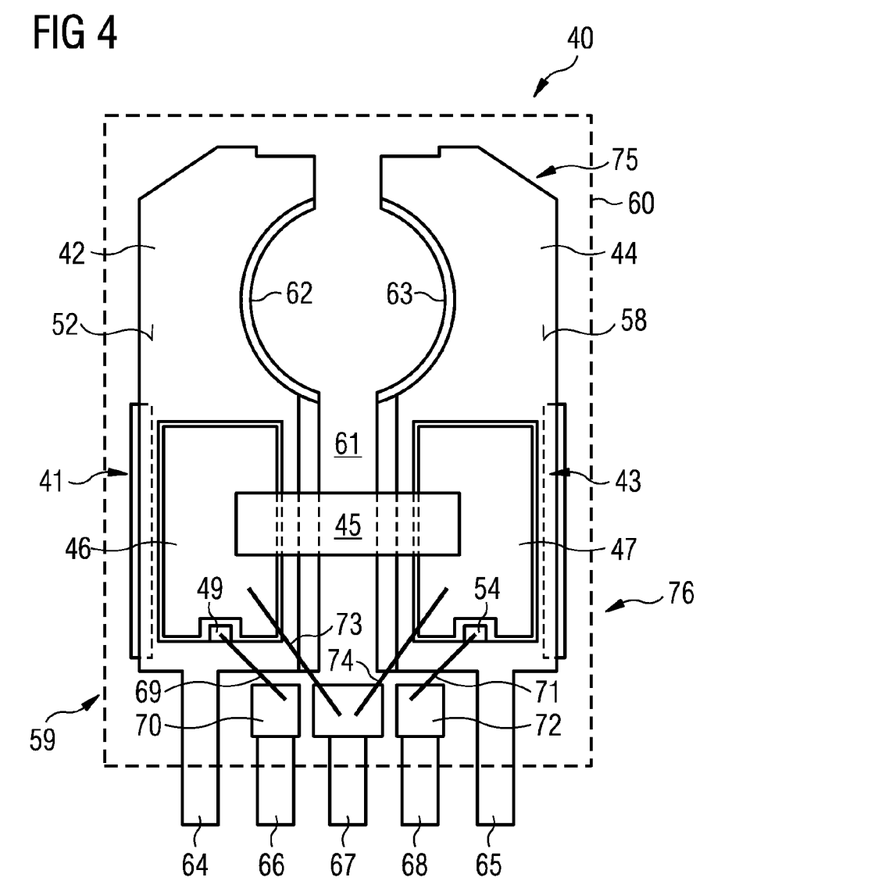
FIG. 4 illustrates a schematic top view of a semiconductor device package according to the second embodiment.

FIG. 3 illustrates a cross-sectional view of a semiconductor device package 40 including a bidirectional switch circuit according to a second embodiment and FIG. 4 illustrates a plan view of the semiconductor device package 40.

The bidirectional switch circuit includes a first transistor 41 mounted on a first die pad 42, a second transistor 43 mounted on a second die pad 44 and a conductive connector 45 which electrically couples a source 46 of the first transistor 41 to a source electrode 47 of the second transistor 43. The first transistor 41 and the second transistor 43 are, in this embodiment, silicon-based n-channel MOSFET devices.

The first transistor 41 includes an upper surface 48 on which a source electrode 46 and a gate electrode 49 are positioned. A drain electrode 50 is positioned on the lower surface 51 of the first transistor 41 and is mounted on, and electrically coupled to an upper surface 52 of the first die pad 42 by solder 53.

The second transistor 43 also includes a source electrode 47 and a gate electrode 54 on its upper surface 55 and a drain electrode 56 on its lower surface 57. The drain electrode 56 is mounted on, and electrically coupled to, an upper surface 58 of a second die pad 44 by solder 53.

The first die pad 42 is arranged adjacent to, and spaced apart from, the second die pad 44. The first die pad 42 and the second die pad 44 may be considered as portions of a split die pad. In this embodiment, the first die pad 42 and the second die pad 44 form part of a leadframe 59 of the semiconductor device package 40. The leadframe 59 is electrically conductive and may include a metal, such as copper. The first die pad 42 and the second die pad 44 may have the same area and thickness and be arranged in a common plane.

The semiconductor device package 40 further includes a housing 60 formed by epoxy resin which surrounds the first transistor 41, the second transistor 43, a conductive connector 45, the first die pad 42 and the second die pad 44. The epoxy resin electrically insulates the first die pad 42 and the second die pad 44 from one another.

The conductive connector 45 is provided, in this second embodiment, in the form of a clip which extends between the source electrode 46 of the first transistor 41 and the source electrode 47 of the second transistor 43 and provides a current path within the housing 60 for the bidirectional switch circuit. The clip may be coupled to the source electrode 46 and the source electrode 47 by solder, for example.

The lateral layout of the leadframe 59 including the first die pad 42, the second die pad 44 and leads is illustrated in the top view of the semiconductor device package 40 of FIG. 4. Each die pad 42, 44 includes a first end 75 and a second end 76 on which the respective transistor 41, 43 is mounted. The first die pad 42 is separated from the second die pad 44 by a gap 61 which is filled by the epoxy resin of the housing 60. The side face 62 of the die pad 42 which faces towards the second die pad 44 includes a curved cutout in the first end 75. Similarly, the side face 63 of the second die pad 44 which faces the first die pad 42 includes a corresponding curved cutout in the first end 75.

The first transistor 41 and the second transistor 43 are arranged on the opposing second end 76 of the first die pad 42 and second die pad 44, respectively. A first drain lead 64 extends from the second end 76 of the first die pad 42 to the outside of the housing 60 and a second drain lead 65 extends from the second end 76 of the second die pad 44 to outside of the housing 60.

The semiconductor device package 40 includes a further three leads 66, 67, 68 which are positioned between the first drain lead 64 and the second drain lead 65 and are spaced at a distance from the second end 76 of the first die pad 42 and the second end 76 of the second die pad 44. The further three leads 66, 67, 68 are electrically insulated from the first die pad 42 and the second die pad 44 and from one another by the epoxy resin of the housing 60. The lead 66 is positioned adjacent the first drain lead 64, the lead 67 is positioned adjacent the first lead 66 and faces the gap 61 between the first die pad 42 and the second die pad 44 and the lead 68 is positioned between the second lead 67 and the second drain lead 65.

The bidirectional bridge circuit further includes a conductive connector 69 extending between the gate electrode 49 on the upper surface 48 of the first transistor 41 and an inner contact area 70 of the lead 66. The conductive connector 69 may be provided by a bond wire, for example. The conductive connector 69 and the inner contact area 70 are positioned within the housing 60.

Similarly, the bidirectional switch circuit includes a second conductive connector 71 extending between the gate electrode 54 of the second transistor 43 and an inner contact pad 72 of the lead 68. The second conductive connector 71 may be a bond wire, for example. The central lead 67 provides a sense lead for the semiconductor device package 40 and is electrically coupled to the source electrode 46 of the first transistor 41 by a conductive connector 73, for example a bond wire, and to the source electrode 47 of the second transistor 43 by a conductive connector 74, which is a bond wire, for example.

The semiconductor device package 40, therefore, includes five leads 64, 66, 67, 68, 65 which extend outside of the housing 60. The pinout arrangement is, from left to right in the top view of FIG. 4, Drain 1, Gate 1, Sense, Gate 2, Drain 2. The pin Drain 1 provides a first input/output lead of the bidirectional switch and the lead Drain 2 provides a second input/output lead. The current path from the source electrode 46 of the first transistor to the source electrode 47 of the second transistor is arranged entirely within the semiconductor device package 40 and entirely within the housing 60. The sense conductive connectors 73, 74 to the sense lead 67 do not provide any part of the current path of the bidirectional switch.

The conductive connector 45, which extends between the source electrodes 46, 47 may have a larger cross-sectional area and lower resistivity than the separate conductive connectors 73, 74 providing the sense function. Consequently, a low resistance conductive connector may be provided for the current path of the bidirectional switch circuit, i.e. be conductive connector 45, and higher resistivity conductive connections may be provided for the sense function by conductive connectors 73, 74.

The transistors 41, 43 and the conductive connectors 45, 69, 73, 74, 71 may be arranged such that there is a mirror symmetry around a line of symmetry extending through the centre longitudinal line of the sense lead 67. The symmetrical arrangement of the conductive connectors and transistors may be used to assist in the provision of a bidirectional switch circuit which has similar properties for a current path from the first drain lead 64 to the second drain lead 65 and for a current path from the second drain lead 65 to the first drain lead 64.

Figure 5:
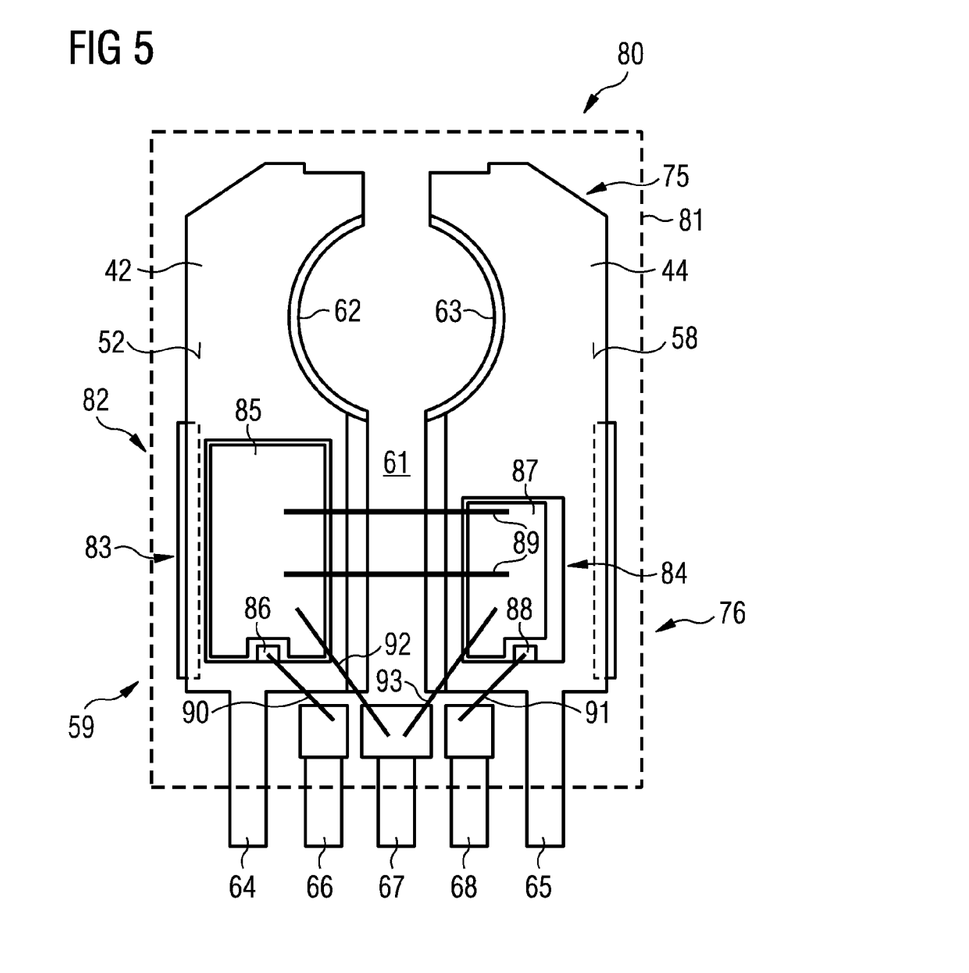
FIG. 5 illustrates a schematic top view of a semiconductor device package according to a third embodiment.

FIG. 5 illustrates a schematic top view of a semiconductor device package 80 according to a third embodiment. The semiconductor device package 80 includes a lead frame 59 which includes a first die pad 42, a second die pad 44 and five leads 64, 65, 66, 67, 68 having the same arrangement as that illustrated in FIG. 4. Therefore, reference is made to the description of FIG. 4 for these elements.

The semiconductor device package 80 includes a housing including epoxy resin which encapsulates the first die pad 42, the second die pad 44 and inner portions of the five leads 64, 65, 66, 67, 68. The side faces of the housing are indicated in FIG. 5 with a dashed line 81.

The semiconductor device package 80 includes a bidirectional switch 82 including a first transistor 83 and a second transistor 84. The first transistor 83 and the second transistor 84 each include, in this embodiment, a silicon based n-channel MOSFET device such as a CoolMOS™ device. The lateral size of the second transistor 84 is smaller than the lateral size of the first transistor 83.

The first transistor 83 has a drain electrode not seen in FIG. 5 on its lower surface which is mounted on, and electrically coupled to, the upper surface 52 of the first die pad 42 and a source electrode 85 and a gate electrode 86 on its upper surface. Similarly, the second transistor 84 includes a drain electrode on its lower surface which is not seen in FIG. 5 and which is mounted on, and electrically coupled to, the upper surface 58 of the second die pad 44 and a source electrode 87 and a gate electrode 88 on its upper surface.

The source electrode 85 of the first transistor 83 is electrically coupled to the source electrode 87 of the second transistor 84 by a plurality of bond wires 89 which extend between the source electrode 85 of the first transistor 83 and the source electrode 87 of the second transistor 84. Two bond wires are illustrated in FIG. 5. However, one bond wire or more than two bond wires may also be used.

The gate electrode 86 of the first transistor 83 is electrically coupled to the lead 66 by a bond wire 90. The gate electrode 88 of the second transistor 84 is electrically coupled to the lead 68 by a bond wire 91. The source electrode 85 of the first transistor 83 is electrically coupled by bond wire 92 to the central lead 67 and the source electrode 87 of the second transistor 84 is electrically coupled to the lead 67 by a bond wire 93. The electrical connections provided by the bond wires 92, 93 between the source electrodes 85, 87 and the common lead 67 provide a sense function for the semiconductor device package 80. The bond wires 92, 93 do not form part of the current path of the bidirectional switch 82.

Due to the differing size, the $R_{DS(on)}$ of the first transistor 83 may be different to the $R_{DS(on)}$ of the second transistor 84.

In the semiconductor device package 80, the first transistor 83 is larger than the second transistor 84 so that the first transistor 83 has a larger $R_{DS(on)}$ than the second transistor 84. The semiconductor device package 80 includes a bidirectional switch circuit including unsymmetrical transistors, i.e. the transistors are of differing size and/or differing $R_{DS(on)}$, and may be used in applications in which, for example, the switch predominantly carries current in one direction and to a lesser extent in the opposing direction.

The die pads 42, 44 are illustrated in FIGS. 4 and 5 as having a symmetrical shape and are of the same size. However, the two die pads are not limited to this arrangement and may have differing sizes and may or may not have a symmetrical arrangement. The arrangement of the leads 64, 65, 66, 67, 68 with respect to the die pads 42, 44 and the pin order of the leads 64, 65, 66, 67, 68 is not limited to that illustrated and may vary.

The leads 64, 65, 66, 67, 68 are arranged substantially parallel to one another and are arranged on a common side of the die pads 42, 44. However, the arrangement of the leads 64, 65, 66, 67, 68 with respect to the side of the die pads 42, 44 and the pinout arrangement of the leads 64, 65, 66, 67, 68 is not limited to that illustrated and may vary. For example, the leads coupled to one transistor may be arranged on one side of the package and the leads for a second transistor may be arranged on a different, for example, the opposing side, of the package.

The semiconductor device packages according to the various embodiments described herein each include a bidirectional switch circuit within a single housing and within a single package outline. Standard package outlines such as a TO-247 or a TO-220 outline with five leads may be used for the semiconductor device package. This enables the bidirectional switch circuit to be provided in a single package rather than in several packages which are then mounted next to each other on the circuit board to provide a bidirectional switch. By providing the bidirectional switch circuit in a single package, space may be saved on the circuit board, for example.

Figure 6:
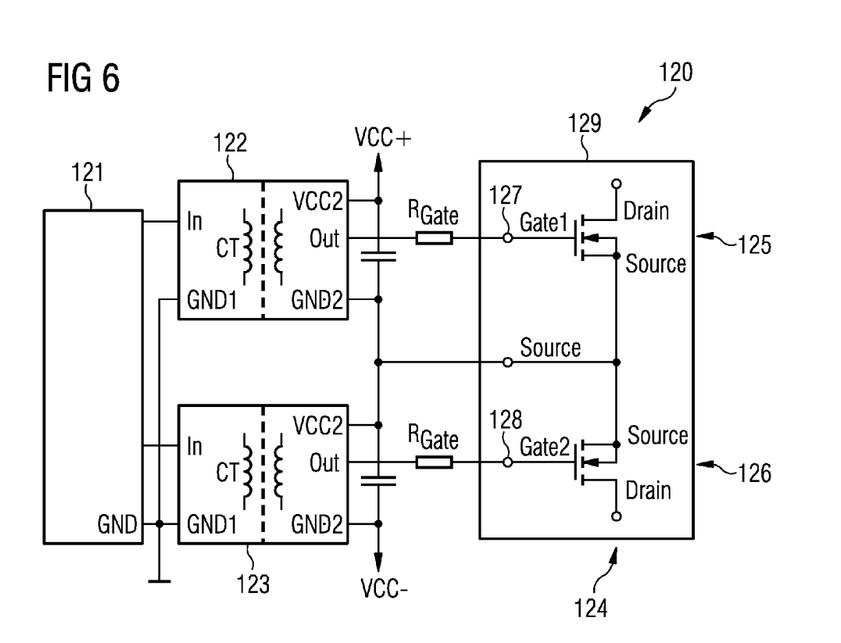
FIG. 6 illustrates a power factor correction circuit including a bidirectional switch circuit.

The semiconductor device packages according to the various embodiments described herein may be used in various applications. FIG. 6 illustrates an example of an application in which the semiconductor device package including a bidirectional switch circuit may be used.

FIG. 6 illustrates a power factor correction circuit 120 for use in a power supply such as a switch mode power supply. The power factor correction circuit 120 includes a microcontroller 121, two gate drivers 122, 123 and a bidirectional switch circuit 124 including two transistors 125, 126. The first gate driver 122 is electrically coupled to the gate 127 of the first transistor 125 of the bidirectional switch circuit 124 and the second gate driver 123 is electrically coupled to the second gate 128 of the second transistor 126. The bidirectional switch circuit 124 is provided by a single semiconductor device package as is indicated in FIG. 6 by box 129.

The semiconductor device packages according to the various embodiments described herein may be used in uninterruptible power systems, 4Q switches, matrix inverters, AC choppers, in a main HV-DC switch such as a high voltage battery system in electric vehicles or hybrid electric vehicles, battery chargers and storage systems.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device package, comprising:
a bidirectional switch circuit, comprising:
a first semiconductor transistor with an upper surface on which a source electrode and a gate electrode are positioned and a lower surface on which a drain electrode is positioned, the drain electrode being mounted on and electrically coupled to an upper surface of a first die pad;
a second semiconductor transistor with an upper surface on which a source electrode and a gate electrode are positioned and a lower surface on which a drain electrode is positioned, the drain electrode being mounted on and electrically coupled to an upper surface of a second die pad;
a housing comprising an epoxy resin and a conductive connector providing a current path of the bidirectional switch circuit, extending between a source electrode of the first transistor and a source electrode of the second transistor, wherein the second die pad is adjacent to and separated from the first die pad by the epoxy resin, each die pad including a first end and a second end on which the respective transistor is mounted;
a first drain lead extending from the second end of the first die pad to the outside of the housing and a second drain lead extends from the second end of the second die pad to outside of the housing,
a first gate lead, a sense lead and a second gate lead which are positioned between the first drain lead and the second drain lead and are spaced at a distance from the second end of the first die pad and the second end of the second die pad and electrically insulated from the first die pad and the second die pad and from one another by the epoxy resin of the housing, wherein the first gate lead is positioned adjacent the first drain lead, the sense lead is positioned adjacent the first gate lead and faces the gap between the first die pad and the second die pad and the second gate lead is positioned between the sense lead and the second drain lead,
a conductive connector within the housing extending between the gate electrode on the upper surface of the first transistor and an inner contact area of the first gate lead and a second conductive connector within the housing extending between the gate electrode of the second transistor and an inner contact pad of the second gate lead, wherein the sense lead is electrically coupled to the source electrode of the first transistor by a conductive connector and to the source electrode of the second transistor another conductive connector, and wherein the conductive connector extending between the source electrode of the first transistor and a source electrode of the second transistor has a larger cross-sectional area and lower resistivity than the separate conductive connectors providing the sense function.

2. The semiconductor device package according to claim 1, wherein the conductive connector comprises one of a clip and at least one bond wire.

3. The semiconductor device package according to claim 1, wherein the epoxy resin electrically insulates the first die pad from the second die pad.

4. The semiconductor device package according to claim 1, wherein the epoxy resin encapsulates the conductive connector providing a current path of the bidirectional switch circuit.

5. The semiconductor device package according to claim 1, wherein the package is configured to have one of a TO-220 outline and a TO-247 outline.

6. The semiconductor device package according to claim 1, wherein the first transistor and the second transistor are arranged mirror symmetrically in the semiconductor device package.

7. The semiconductor device package according to claim 1, wherein the first transistor is one of a MOSFET, IGBT and a Group III-nitride based transistor and the second transistor is one of a MOSFET, IGBT and a Group III-nitride based transistor.

8. The semiconductor device package according to claim 1, wherein the first transistor has a larger lateral area than a lateral area of the second transistor.

9. The semiconductor device package according to claim 1, further comprising a first input/output lead extending from the first die pad and a second/output/input lead extending from the second die pad, a first gate lead and a second gate lead.

* * * * *